(12) United States Patent
Lee et al.

(10) Patent No.: US 7,083,897 B2
(45) Date of Patent: Aug. 1, 2006

(54) METHOD OF FABRICATING A POLY FUSE

(75) Inventors: Yuan-Pang Lee, Miaoli (TW);
Chen-Shiang Shieh, Hsinchu (TW);
Ping-Hung Yin, Taipei (TW); Fei-Yun Chen, Hsinchu (TW); Yuan-Ko Hwang, Hualien (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 355 days.

(21) Appl. No.: 10/438,681

(22) Filed: May 15, 2003

(65) Prior Publication Data

US 2004/0229168 A1 Nov. 18, 2004

(51) Int. Cl.
*G03C 5/00* (2006.01)

(52) U.S. Cl. ............. 430/311; 430/313; 430/314; 134/2; 134/36

(58) Field of Classification Search .............. None
See application file for complete search history.

(56) References Cited

U.S. PATENT DOCUMENTS

| 5,306,671 | A | 4/1994 | Ogawa et al. ............ 437/225 |
| 5,858,878 | A | 1/1999 | Toda ........................ 438/725 |
| 6,124,211 | A | 9/2000 | Butterbaugh et al. ....... 438/708 |
| 6,255,715 | B1 | 7/2001 | Liaw ......................... 257/529 |
| 6,489,227 | B1 * | 12/2002 | Hsieh et al. ................ 438/601 |

* cited by examiner

*Primary Examiner*—John A. McPherson
*Assistant Examiner*—Daborah Chacko-Davis

(57) ABSTRACT

A new method is provided to create a polysilicon fuse. The invention provides for applying a first oxide plasma treatment to the surface of the created polysilicon fuse, creating a thin layer of native oxide over the surface of the created polysilicon fuse, followed by a DI water rinse. This thin layer of native oxide is made more robust by applying a second oxide plasma treatment to exposed surfaces, this more robust layer of native oxide protects the polysilicon fuse during subsequent processing steps of wet photoresist and polymer removal.

52 Claims, 3 Drawing Sheets

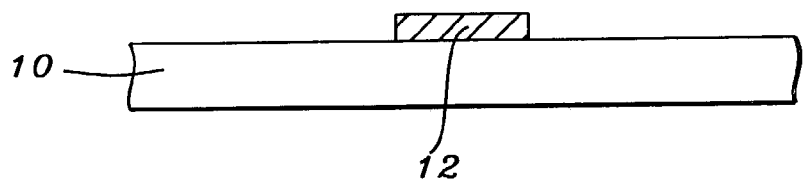
FIG. 1 – Prior Art
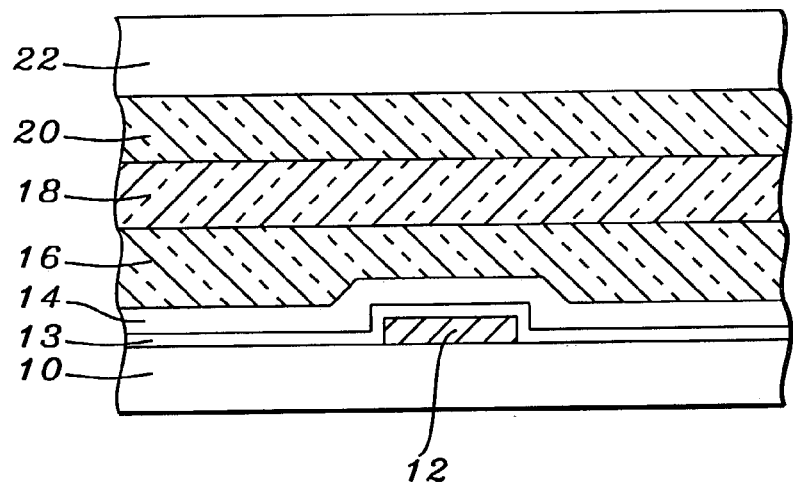
FIG. 2 – Prior Art
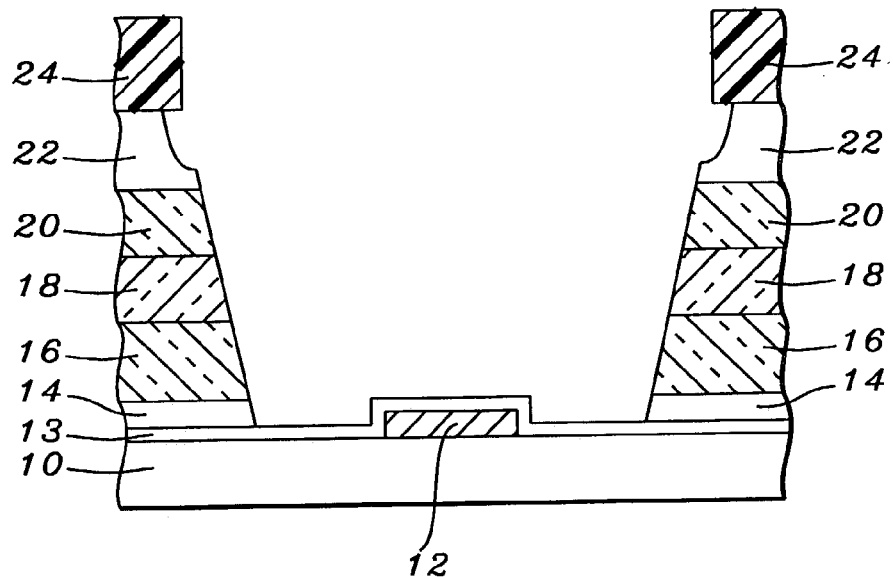
FIG. 3 – Prior Art

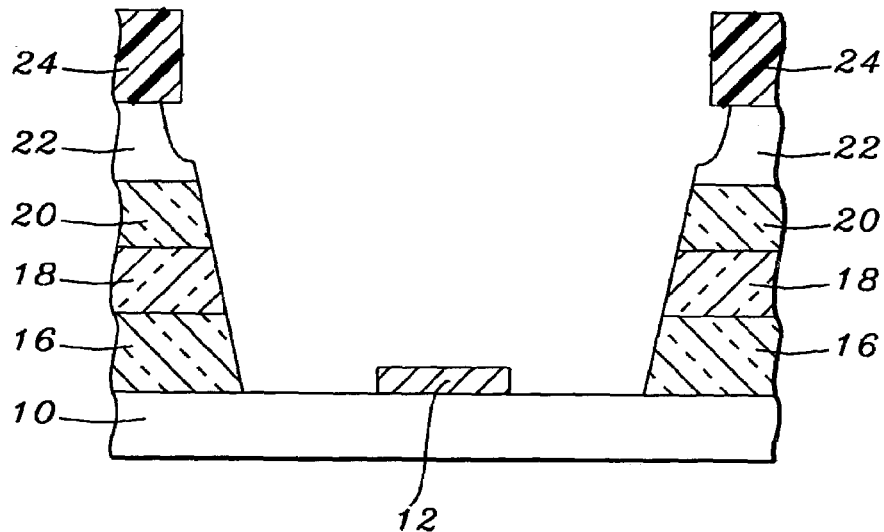
FIG. 4 - Prior Art
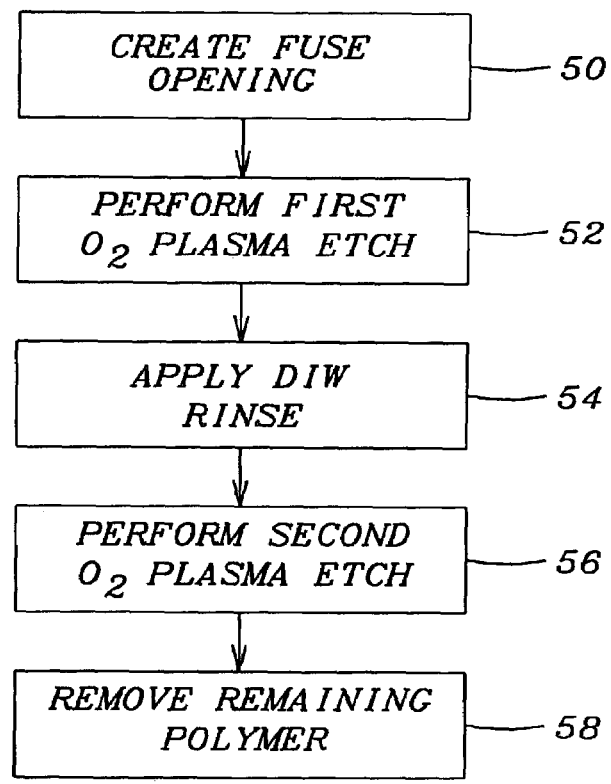
FIG. 5

METHOD OF FABRICATING A POLY FUSE

BACKGROUND OF THE INVENTION (1) Field of the Invention

The invention relates to the fabrication of integrated circuit devices, and more particularly, to a method of creating a polysilicon fuse such that the fuse is not damaged by process steps of etch and photoresist remove.

(2) Description of the Prior Art

One of the methods that is typically applied for the further extension and use of created semiconductor devices is to create one or more fuses as part of the semiconductor device creation process. By selectively interrupting or "blowing" these fuses, circuit functions can be provided after basic device features have been created over the surface of a substrate. Defective devices can be selectively removed or new devices can be created, based on device failure analysis results, by creating new paths of electrical conductivity within a semiconductor device. The objective of this procedure of creating and using fuses over the surface of a substrate, over which concurrently multiple additional semiconductor devices have been created, is to minimize device failures by optimally using functional units or sections thereof.

Specifically, fuses can be used to rewire memory and logic semiconductor devices. By for instance blowing fuses that are associated with identified defective memory cells, these defective memory cells can be removed as actively functional units and can at the same time be replaced with created spare rows or columns of memory cells that have been created for the purpose of replacement. Relating to logic devices, it is not uncommon and more cost-effective to create, for certain device functions and applications, generic logic chips, which can in their original design perform a number of different logic functions. For these logic devices to perform a specific logic function, one or more fuses are typically blown, thus in effect creating a more personalized semiconductor device that now performs a more specialized logic function. This approach allows for creating a number of specific logic chips from a generic chip, thereby providing a significant cost reduction of the created logic devices.

It is well known in the art that the increased complexity of semiconductor devices brings with it an increased complexity in the layers of interconnect metal that must be created overlying active devices in order to interconnect these devices. For this reason it is not uncommon to see from two to four overlying layers of interconnect metal created in overlying layers of Intra Level Dielectric (ILD) and Inter Metal Dielectric (IMD). The above referred to process of blowing one or more fuses to further affect the creation of a functional semiconductor device requires that these fuses are accessible to exposure for purposes of heating the fuse by for instance exposure to a laser beam. This requires that an opening must be created aligned with the fuse or fuses so that the energy that is provided by the laser beam can adequately heat the fuse or fuses that must be interrupted. It is clear from this that the process of creating openings that are aligned with one or more fuses, in view of the multiple layers of IMD and ILD that are typically created overlying the fuses, can be cumbersome and may be difficult to control. It is critical that etching of the overlying layers of dielectric does not damage the fuse, this potential damage to a fuse may prematurely open the fuse thereby defeating the purpose of creating the fuse.

Fuses that are used for the above highlighted objectives of device creation can be made using either doped or undoped polysilicon or can be made using metal. The invention specifically addresses aspects of creating polysilicon fuses and the problems encountered therewith. It can thereby generally be stated that as an objective of creating a fuse comprising polysilicon that this fuse should be created such that the fuse is exposed for blowing thereof without however having incurred any damage to the fuse in the process that is required to expose the fuse. The invention addresses these concerns for a polysilicon fuse.

U.S. Pat. No. 6,124,211 (Butterbaugh et al.) shows a method to remove native oxides.

U.S. Pat. No. 6,255,715 B1 (Liaw) is a related patent.

U.S. Pat. No. 5,306,671 (Ogawa et al.) shows a surface treatment method. This patent provides for forming a film of native oxide over the surface of a silicon substrate, this film is etched by a first plasma etch employing a gas containing fluorine. The surface of the substrate is again subjected to a second plasma etching by employing a gas containing fluorine in order to remove a surface damaged layer and a fluorocarbon layer formed during the above step of first plasma etching. The substrate is then radiated with UV rays under low pressure in order to disassociate and remove fluorine atoms that have chemically interacted with the substrate during the second plasma etching. The instant invention does not apply the methods provided by this patent.

U.S. Pat. No. 5,858,878 (Toda) shows a post etch step.

SUMMARY OF THE INVENTION

A principle objective of the invention is to provide a method of creating a polysilicon fuse using a simplified processing sequence.

Another objective of the invention is to provide a method of creating a polysilicon fuse whereby negative effects such as excessive contamination due to front-end polysilicon etch is removed.

Yet another objective of the invention is to provide a method of creating a polysilicon fuse whereby the thickness of the layer of dielectric remaining in place overlying the created polysilicon fuse is such that the created polysilicon fuse is not attacked by post-poly etch processing steps.

In accordance with the objectives of the invention a new method is provided to create a polysilicon fuse. The invention provides for applying a first oxide plasma treatment to the surface of a created polysilicon fuse, creating a thin layer of native oxide over the surface of the created polysilicon fuse, followed by a DI water rinse. This thin layer of native oxide is made more robust by applying a second oxide plasma treatment to exposed surfaces, this more robust layer of native oxide protects the polysilicon fuse during subsequent processing steps of wet photoresist and polymer removal.

BRIEF DESCRIPTION OF THE DRAWINGS

FIGS. 1 through 4 show prior art methods of creating and providing access to a polysilicon fuse, as follows:

FIG. 1 shows a semiconductor surface over the surface of which a polysilicon fuse has been created.

FIG. 2 shows a cross section after a number of layers of semiconductor materials have been deposited overlying the polysilicon fuse.

FIG. 3 shows a cross section after the layers overlying the polysilicon fuse have been etched, a layer of IPO is used.

FIG. 4 shows a cross section after the layers overlying the polysilicon fuse have been etched using a carefully controlled etch time without using a layer of IPO.

FIG. 5 shows a flowchart of the processing steps that are provided by the invention.

DESCRIPTION OF THE PREFERRED EMBODIMENTS

Figure 6:
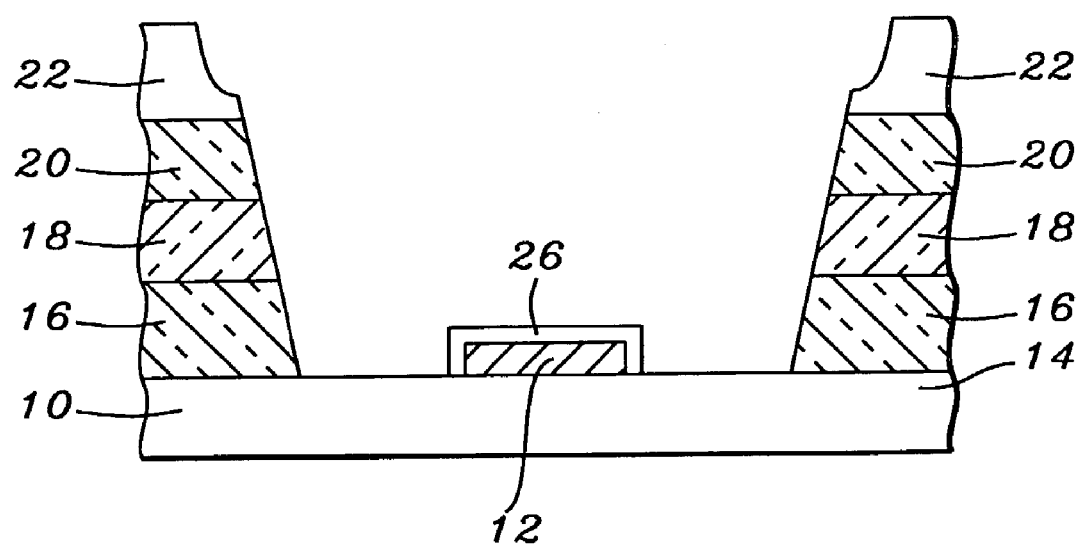
FIG. 6 shows a cross section of the surface of a substrate over the surface of which a polysilicon fuse of the invention has been created.

A number of generic terms that are used for the explanation of the invention are first introduced.

1. ACT is the commercial term for a chemical that serves as a wet chemical solvent for the removal of photoresist; this chemical is known to chemically interact with polysilicon, causing damage to polysilicon such as for instance polysilicon that is used as a patterned layer of a fuse; ACT has a high etch rate of about 1,100 Angstrom per minute when applied to polysilicon, and
2. EKG is the commercial term for a chemical that serves as a wet chemical solvent that can be used instead of ACT for the removal of photoresist; this chemical does not chemically interact with polysilicon, preventing damage to polysilicon such as for instance polysilicon that is used as a patterned layer of a fuse; EKG has an etch rate of zero (0) Angstrom per minute when applied to polysilicon.

There are instances of application of photoresist removal whereby the process cannot, for various reasons, replace the (undesirable, from a point of view of affecting the polysilicon of for an instance a fuse) ACT with (the more desirable) EKG. The invention addresses these instances where the process of photoresist removal must make use of ACT. Special measures must in those instances be taken to avoid chemical interaction between the ACT and the polysilicon of the fuse.

For a better understanding of the invention, the following points are of interest:

processing of semiconductor devices is typically subdivided into front-end processing and back-end processing whereby the front-en processing is separated from the back-end processing by steps of creating metal interconnects over semiconductor surfaces of the device that is being processed front-end processing typically uses sulfuric acid ($H_2SO_4$) and mixtures of $H_2SO_4$ with other oxidizing agents such as hydrogen peroxide ($H_2O_2$) in stripping photoresist after the photoresist has been stripped by other means back-end processing typically uses ACT solvent to remove photoresist; the creation of a fuse opening is a back-end process, which applies an ACT solvent the invention addresses problems associated with creating a fuse opening, the fuse being created of polysilicon, and, since this creating of a fuse opening is a back-end process, the invention addresses the affects that the use of ACT has on a polysilicon surface, and the invention provides a method that uses ACT stripping for the removal of photoresist and polymer whereby a layer of polysilicon, in this case comprising a polysilicon fuse, is exposed at the time that the ACT is applied.

The term ACT refers to the name of a commercially available product and the company that provides this product. The main components of ACT are about 25% di-methyl-sulfor-oxide (DMSO), about 70% mono-ethanol-amin (MEA) and about 5% of inhibitor catechol.

To better understand the processing environment that is addressed by the invention, the creation of a polysilicon fuse is first briefly highlighted followed by a overview description of an ultimate location of the created polysilicon fuse.

For the first description, FIG. 1 is used whereby it must be emphasized that, in view of the nature of the problem that is addressed by the invention, this created polysilicon fuse is only shown to the extent that this is required for the explanation of the invention.

Referring now specifically to the cross section that is shown in FIG. 1, there is shown a semiconductor surface 10 over the surface of which a polysilicon fuse 12, shown here in cross section, has been created. The semiconductor surface 10 can be any of the layers of semiconductor material that is applied in creating a semiconductor device. Most typically the semiconductor surface 10 is the surface of a silicon substrate over which active semiconductor devices are created, potentially in combination with passive semiconductor components such as the polysilicon fuse and other components such as resistors, inductors and capacitors. The polysilicon fuse 12 of FIG. 1 is first highlighted in order to emphasize that this fuse, after its creation, is no longer affected during a (typically large) number of processing steps that is required to further complete a semiconductor device. Of these steps can be cited frequently used steps of creating overlying layers of interconnect traces that are created in overlying layers of dielectric, whereby adjacent layers of interconnect traces are connected by conductive contacts or vias.

This overlying of the created polysilicon fuse 12 with a number of layers of semiconductor materials is highlighted by the example of such an application that is shown in the cross section of FIG. 2, where by way of example have been shown the layers:

12, the poly-1 layer of the polysilicon fuse
13, an Inter-Poly Oxide (IPO) stop layer that is used as etch stop of the etch of the layers overlying fuse 12
14, an overlying and protective layer of poly-2
16, a layer of ILD
18, a first layer of IMD
20, a second layer of IMD
22, a layer of passivation.

All of the layers that are shown in cross section of FIG. 2 are conventional layers of semiconductor material that are typically applied in the manner and in the sequence that is shown in cross section in FIG. 2. It is however clear from the cross section of FIG. 2 that the creation of an opening that is aligned with the fuse 12 is a relatively extensive process due to the number and variety of layers overlying the fuse 12.

The process of etching the layers overlying the polysilicon fuse is further highlighted using the cross sections of FIGS. 3 and 4, whereby FIG. 3 uses a layer 13 of IPO while FIG. 4 represents the case of a carefully controlled etch time without using a layer of IPO. A photoresist mask 24 has been created for both the cross sections of FIG. 3 and FIG. 4.

The conventional problems that are experienced with the method that is shown in FIG. 3 is that this process is very time-consuming, making this process very expensive to apply. For the process that is shown in cross section in FIG. 3, an oxide etch is applied to remove layers 22, 20 18 and 16 in accordance with the photoresist mask 24, this oxide etch stops on the layer 14 of poly-2. After this oxide etch has been completed, the layer of 14 poly-2 is removed in accordance with the photoresist mask 24. The layer 13 of IPO remains in place to protect the surface of the layer of poly-1 during processes of removal of the photoresist mask 24.

In the process that is highlighted in the cross section of FIG. 4, no layer of poly-2 is typically applied over the surface of the poly-1 fuse. The etch that is shown in the cross section of FIG. 4 is a timed oxide etch that is timed to stop at the layer of poly-1 of the fuse. In the process that is shown in cross section in FIG. 4, the layer 12 of poly-1 is not protected by an overlying layer, the poly-1 fuse is therefore not protected against chemical interaction with the photoresist removal agents at the time that the photoresist mask 24 is removed.

The above can be summarized as follows:

etching to create an opening that is aligned with a poly-1 fuse is a complicated and special process to avoid damage caused by photoresist removal, one of two methods can be used:
1. a layer of IPO as an etch stop layer, or
2. a time-controlled etch, whereby the etch time is carefully controlled for an etch process where a layer of IPO is used as the etch stop layer, a layer of poly-2 is used in addition to and overlying the IPO layer, both layers of poly-2 and IPO serving as etch stop layers; during this etch process, all overlying layers such as layers of passivation, IMD and ILD are removed, in addition a part of the etch stop layer of poly-2 is removed; the remainder of the poly-2 is removed by a following step of poly etch, resulting in a thin layer of IPO remaining in place overlying the surface of and serving as protective layer of the layer of poly-1 of the poly fuse the use of the two layers of poly-2 and IPO result in:
1. a more complicated process due to the two additional layers and exposure masks, while
2. the use of a front-end poly-2 etcher to remove the remaining poly-2 (of the etch stop layer) is likely to result in undesirably contamination, further
3. in using a $CL_2$ based poly etchant, a high risk of contact pad corrosion is introduced to contact pads, which are simultaneously exposed using the second approach, that is without the use of etch stop layers of IPO and poly-2 and applying a time-controlled etch of the layers overlying the poly-1 fuse, the fuse etch is carefully controlled in order to leave a layer of ILD partially in place overlying the poly-1 fuse; this however results in:
1. a (relative) thick layer of ILD causing problems of blowing (burn-down) of the fuse resulting in low yield, and
2. a (relatively) thin layer of ILD exposes the surface of the poly-1 fuse to chemical interaction with the photoresist remover, such as the previously highlighted ACT.

The invention addresses the above concerns by providing a method to avoid photoresist removal damage while eliminating the above highlighted disadvantages of conventional methods. The invention provides an oxide plasma treatment, combined with a DIW rinse in order to form a thin layer of native oxide over the surface of the poly-1 fuse. Due to the high poly-1 versus oxide selectivity and to the zero etch rate of the photoresist remover, such as ACT, the created thin layer of oxide protects the surface of the poly-1 fuse during the process of wet bench photoresist and polymer stripping that follows the creation of a fuse opening.

For the removal (stripping) of metal, passivation material, photoresist and polymers, a wet bench photoresist stripping (PRS) process is widely used as a back-end processing procedure. The chemistry that is applied for the PRS procedure includes the stripper ACT and solvents such as NMP and NOE. NMP is a solvent-type stripper and contains N-Methyl-pyrolidinone.

These chemistries provide good photoresist versus oxide and photoresist versus metal etch selectivity and are effective as photoresist and polymer removal agents. The disadvantage however, as previously highlighted, is that ACT chemically interacts with polysilicon, making it necessary to provide additional steps to protect the polysilicon fuse over which an opening is being etched.

Oxygen plasma ashing can be applied for the removal of a photoresist mask. Oxygen plasma ashing is heating the photoresist in a highly oxidized environment, preferably for the invention in an oxygen plasma, thereby converting the photoresist to an easily removed ash. As processing conditions for such an oxide ashing process can be cited applying a pressure of between about 1 and 3 Torr at a temperature between about 200 and 300 degrees C., supplying $O_2$ at a flow rate of between about 2,500 and 3,500 sccm, with an applied rf power of between about 600 and 800 Watt to convert the $O_2$ gas to a plasma, the time for the ashing being between about 2 and 3 minutes.

The processing steps, shown in flowchart format in FIG. 5, that are provided by the invention are as follows, these processing steps do not make use of etch stop layers such as a layer of IPO or a layer of poly-2:

1. FIG. 5, step 50, etching the layers overlying the poly-1 fuse but as yet not stripping the photoresist mask; the overlying layers of IMD, passivation and ILD are etched using a timed etch; this timed etch has been extended to where the surface of the poly-1 fuse is exposed, as shown in the cross section of FIG. 4
2. FIG. 5, step 52, stripping the photoresist (mask) by $O_2$ ashing, at the same time affecting the surface of the created poly-1 fuse; this step is performed by applying a first $O_2$ plasma to exposed surfaces, this first $O_2$ plasma exposure creates a thin layer of native oxide over the surface of the poly-1 fuse, this native oxide is potentially not yet completely formed over the surface of the poly-1 fuse during this step due to the presence of polymer residue
3. FIG. 5, step 54, applying a DIW rinse to expose surfaces, thereby swelling, softening and partially removing sidewall polymers that have accumulated on the sidewalls of the created opening; this swelling and partial removal of accumulated polymers allows (prepares) for more extensive and intensive treatment of the exposed surface of the poly-1 fuse, that is prepares for the complete formation of a layer of native oxide over the surface of the poly fuse
4. FIG. 5, step 56, applying a second $O_2$ plasma treatment to the exposed surfaces, this second $O_2$ plasma treatment further establishes (completely forms) a thin layer of native oxide over the surface of the poly-1 fuse by increasing the thickness of the original thin layer of native oxide, making this thin layer of native oxide more robust, and
5. FIG. 5, step 58, removing a remaining polymer by applying photoresist remover such as ACT; the created relatively robust layer of native oxide over the surface of the created poly-1 fuse now protects the poly-1 fuse from interaction with the photoresist and polymer removal agent.

The final structure that has been created using the method and procedures of the invention is shown in cross section in FIG. 6, where the now familiar layers of dielectric and passivation have been highlighted, the photoresist mask 24 (FIG. 4) has been removed from the surface of the passivation layer 22 and where the poly-1 fuse 12 is now surrounded by a layer 26 of native oxide.

The invention has:
1. provided for good fuse performance by protecting the surface of the poly-1 fuse during back-end polymer and photoresist removal
2. removed the need for a thick layer of semiconductor material remaining in place after the opening exposing the poly-1 fuse has been created, thus facilitating requirements of fuse blowing (the fuse is directly accessible, therefore can be readily exposed to energy and thereby opened), and
3. provided a process for the creation of a poly-1 fuse that is less expensive that conventional, prior art processes.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for the creation of a silicon containing fuse, comprising:
    providing a substrate, said substrate having been provided with a silicon containing fuse over the surface thereof, at least one layer of semiconductor material having been formed over said substrate thereby including said at least one silicon containing fuse;
    forming a patterned mask layer on the semiconductor material;
    creating a fuse opening through said at least one layer of semiconductor material;
    after said creating, applying an oxidation treatment to form an oxide layer over exposed surfaces formed by said creating a fuse opening; and
    removing said patterned mask layer.

2. The method of claim 1, said oxidation treatment comprising:
    a first oxide based plasma exposure;
    a DIW rinse;
    a second oxide based plasma exposure; and
    a wet bench photoresist stripper applied to exposed surfaces.

3. The method of claim 2, the first oxide based plasma comprising applying a pressure of between about 1 and 3 Torr at a temperature between about 200 and 300 degrees C., supplying $O_2$ at a flow rate of between about 2,500 and 3,500 sccm, with an applied rf power of between about 600 and 800 Watt to convert the $O_2$ gas to a plasma, the time for the ashing being between about 2 and 3 minutes.

4. The method of claim 2, the second oxide based plasma comprising applying a pressure of between about 1 and 3 Torr at a temperature between about 200 and 300 degrees C., supplying $O_2$ at a flow rate of between about 2,500 and 3,500 sccm, with an applied rf power of between about 600 and 800 Watt to convert the $O_2$ gas to a plasma, the time for the ashing being between about 2 and 3 minutes.

5. The method of claim 2, the first oxide based plasma exposure comprising stripping the patterned mask layer.

6. The method of claim 2, the first oxide based plasma exposure comprising creating a first layer of native oxide over the surface of the silicon containing fuse.

7. The method of claim 2, the DIW rinse comprising swelling, softening and partially removing sidewall polymers accumulated over sidewalls of a created opening, thereby providing for more extensive treatment of the exposed surface of the silicon containing fuse thereby preparing for complete formation of a layer of native oxide over the surface of the silicon containing fuse.

8. The method of claim 2, the second oxide based plasma exposure completing formation of a second layer of native oxide over the surface of the silicon containing fuse by increasing the thickness of an original first layer of native oxide, making the layer of native oxide over the surface of the silicon containing fuse more robust.

9. The method of claim 2, the wet bench photoresist stripper applied to exposed surfaces removing remaining polymer.

10. The method of claim 2, the wet bench photoresist stripper comprising applying photoresist remover such as ACT, thereby creating a relatively robust layer of native oxide over the surface of a created silicon containing fuse, thereby protecting the silicon containing fuse from interaction with photoresist and polymer removal agents.

11. The method of claim 10, the ACT comprising about 25% di-methyl-sulfoxide (DMSO), about 70% mono-ethanol-amine (MEA) and about 5% of inhibitor catechol.

12. The method of claim 1, wherein said at least one layer of semiconductor material is a passivation material, an Intra Level Dielectric material or an Inter Metal Dielectric material.

13. The method of claim 1, the silicon containing fuse comprising polysilicon.

14. The method of claim 1, wherein the creating a fuse opening through said at least one layer of semiconductor material comprises etching the at least one layer of semiconductor material having been formed over said substrate without stripping the photoresist mask.

15. The method of claim 1, wherein the etching the at least one layer of semiconductor material comprises a timed etch.

16. The method of claim 15 wherein the timed etch is extended to where the surface of the silicon containing fuse is exposed.

17. The method of claim 1, the patterned mask layer comprising photoresist.

18. A method for the creation of a silicon containing fuse, comprising:
    providing a silicon substrate comprising a silicon containing fuse over which a compound layer of semiconductor material has been formed;
    exposing the silicon containing fuse by applying a patterned mask layer;
    after said exposing, forming an oxide layer over exposed surfaces of said silicon containing fuse exposed during said exposing; and
    removing said patterned mask layer.

19. The method of claim 18, the exposing the silicon containing fuse comprising:
    forming said patterned mask layer on the compound layer of semiconductor material; and
    etching the compound layer of semiconductor material, thereby creating a fuse opening through said compound layer of semiconductor material.

20. The method of claim 19, wherein etching the compound layer of semiconductor material comprises etching the compound layer of semiconductor material without stripping the patterned mask layer.

21. The method of claim 19, wherein the etching the compound layer of semiconductor material comprises a timed etch.

22. The method of claim 21 wherein the timed etch is extended to where the surface of the silicon containing fuse is exposed.

23. The method of claim 19, the patterned mask layer comprising photoresist.

24. The method of claim 18, the forming an oxide layer over exposed surfaces comprising:
   a first oxide based plasma exposure;
   a DIW rinse;
   a second oxide based plasma exposure; and
   a wet bench photoresist stripper applied to exposed surfaces.

25. The method of claim 24, the first oxide based plasma comprising applying a pressure of between about 1 and 3 Torr at a temperature between about 200 and 300 degrees C., supplying $O_2$ at a flow rate of between about 2,500 and 3,500 sccm, with an applied rf power of between about 600 and 800 Watt to convert the $O_2$ gas to a plasma, the time for the ashing being between about 2 and 3 minutes.

26. The method of claim 24, the second oxide based plasma comprising applying a pressure of between about 1 and 3 Torr at a temperature between about 200 and 300 degrees C., supplying $O_2$ at a flow rate of between about 2500 and 3,500 sccm, with an applied rf power of between about 600 and 800 Watt to convert the $O_2$ gas to a plasma, the time for the ashing being between about 2 and 3 minutes.

27. The method of claim 24, the first oxide based plasma exposure comprising stripping the patterned mask layer.

28. The method of claim 24, the first oxide based plasma exposure comprising creating a first layer of native oxide over the surface of the silicon containing fuse.

29. The method of claim 24, the DIW rinse comprising swelling, softening and partially removing sidewall polymers accumulated over sidewalls of a created opening, thereby providing for more extensive treatment of the exposed surface of the silicon containing fuse, thereby preparing for complete formation of a layer of native oxide over the surface of the silicon containing fuse.

30. The method of claim 24, the second oxide based plasma exposure completing formation of a second layer of native oxide over the surface of the silicon containing fuse by increasing the thickness of an original first layer of native oxide, making the layer of native oxide over the surface of the silicon containing fuse more robust.

31. The method of claim 24, the wet bench photoresist stripper applied to exposed surfaces removing remaining polymer.

32. The method of claim 24, the wet bench photoresist stripper comprising applying photoresist remover such as ACT, thereby creating a relatively robust layer of native oxide over the surface of a created silicon containing fuse, thereby protecting the silicon containing fuse from interaction with photoresist and polymer removal agents.

33. The method of claim 32, the ACT comprising about 25% di-methyl-sulfoxide (DMSO), about 70% mono-ethanol-amine (MEA) and about 5% of inhibitor catechol.

34. The method of claim 18, wherein said compound layer of semiconductor material comprises a passivation material, an Intra Level Dielectric material or an Inter Metal Dielectric material.

35. The method of claim 18, the silicon containing fuse comprising polysilicon.

36. A method for the creation of a silicon containing fuse, comprising:
   providing a substrate, said substrate having been provided with a silicon containing fuse over the surface thereof, at least one layer of semiconductor material having been formed over said substrate thereby including said at least one silicon containing fuse;
   forming a patterned mask layer on the semiconductor material;
   creating a fuse opening through said at least one layer of semiconductor material;
   applying an oxidation treatment to form an oxide layer over exposed surfaces, comprising:
   (i) a first oxide based plasma exposure:
   (ii) a DIW rinse;
   (iii) a second oxide based plasma exposure; and
   (iv) a wet bench photoresist stripper applied to exposed surfaces; and
   removing said patterned mask layer.

37. The method of claim 36, wherein said at least one layer of semiconductor material is a passivation material, an Intra Level Dielectric material or an Inter Metal Dielectric material.

38. The method of claim 36, the silicon containing fuse comprising polysilicon.

39. The method of claim 36, the first oxide based plasma comprising applying a pressure of between about 1 and 3 Torr at a temperature between about 240 and 300 degrees C., supplying $O_2$ at a flow rate of between about 2,500 and 3,500 sccm, with an applied rf power of between about 600 and 800 Watt to convert the $O_2$ gas to a plasma, the time for the ashing being between about 2 and 3 minutes.

40. The method of claim 36, the second oxide based plasma comprising applying a pressure of between about 1 and 3 Torr at a temperature between about 240 and 300 degrees C., supplying $O_2$ at a flow rate of between about 2,500 and 3,500 sccm, with an applied rf power of between about 600 and 800 Watt to convert the $O_2$ gas to a plasma, the time for the ashing being between about 2 and 3 minutes.

41. The method of claim 36, wherein the creating a fuse opening through said at least one layer of semiconductor material comprises etching the at least one layer of semiconductor material having been formed over said substrate without stripping the patterned mask layer.

42. The method of claim 36, wherein the etching the at least one layer of semiconductor material comprises a timed etch.

43. The method of claim 42 wherein the timed etch is extended to where the surface of the silicon containing fuse is exposed.

44. The method of claim 36, the first oxide based plasma exposure comprising stripping the patterned mask layer.

45. The method of claim 36, the first oxide based plasma exposure comprising creating a first layer of native oxide over the surface of the silicon containing fuse.

46. The method of claim 36, the DIW rinse comprising swelling, softening and partially removing sidewall polymers accumulated over sidewalls of a created opening, thereby providing for more extensive treatment of the exposed surface of the silicon containing fuse, thereby preparing for complete formation of a layer of native oxide over the surface of the silicon containing fuse.

47. The method of claim 36, the second oxide based plasma exposure completing formation of a second layer of native oxide over the surface of the silicon containing fuse by increasing the thickness of an original first layer of native oxide, making the layer of native oxide over the surface of the silicon containing fuse more robust.

48. The method of claim 36, the wet bench photoresist stripper applied to exposed surfaces removing remaining polymer.

49. The method of claim 36, the wet bench photoresist stripper comprising applying photoresist remover such as ACT, thereby creating a relatively robust layer of native oxide over the surface of a created silicon containing fuse, thereby protecting the silicon containing fuse from interaction with photoresist and polymer removal agents.

50. The method of claim 49, the ACT comprising about 25% di-methyl-sulfoxide (DMSO), about 70% mono-ethanol-amine (MEA) and about 5% of inhibitor catechol.

51. The method of claim 36, the patterned mask layer comprising photoresist.

52. A method for the creation of a silicon containing fuse, comprising:

providing a substrate, said substrate having been provided with a silicon containing fuse over the surface thereof, at least one layer of semiconductor material having been formed over said substrate thereby including said at least one silicon containing fuse;

forming a patterned mask layer on the semiconductor material;

creating a fuse opening through said at least one layer of semiconductor material;

applying an oxidation treatment including an oxide based plasma that both strips said mask layer and forms an oxide layer over surfaces exposed during said creating a fuse opening; and removing said patterned mask layer.

* * * * *

UNITED STATES PATENT AND TRADEMARK OFFICE
CERTIFICATE OF CORRECTION

PATENT NO. : 7,083,897 B2 Page 1 of 1
APPLICATION NO. : 10/438681
DATED : August 1, 2006
INVENTOR(S) : Yuan-Pang Lee et al.

It is certified that error appears in the above-identified patent and that said Letters Patent is hereby corrected as shown below:

Column 10, line 26 in Claim 39, replace "240" with --200--

Column 10, line 33 in Claim 40, replace "240" with --200--.

Signed and Sealed this

First Day of May, 2007

JON W. DUDAS
*Director of the United States Patent and Trademark Office*